United States Patent [19]

Wells et al.

[11] Patent Number: 4,852,746

[45] Date of Patent: Aug. 1, 1989

[54] ORIENTATION AND STORAGE APPARATUS FOR REMOTE CONTROL UNIT

[76] Inventors: Eugene M. Wells, 915 Tascosa Dr., Huntsville, Ala. 35802; L. Keith Thompson, 1104 Kerr Dr., Huntsville, Ala. 35803

[21] Appl. No.: 177,307

[22] Filed: Apr. 5, 1988

[51] Int. Cl.⁴ .............................................. A47F 7/00
[52] U.S. Cl. .................................... 211/13; 248/205.2
[58] Field of Search ................... 211/13, 163, 78, 131, 211/77; 248/205.2

[56] References Cited

U.S. PATENT DOCUMENTS

| | | | |
|---|---|---|---|
| D. 161,333 | 12/1950 | Gooken | 211/42 X |
| 3,243,047 | 3/1966 | Witteborg | 211/163 X |
| 4,030,608 | 6/1977 | Howard | 211/131 |
| 4,609,975 | 9/1986 | Badolato et al. | 211/13 X |
| 4,660,792 | 4/1987 | Rogaliski | 248/205.2 X |
| 4,712,693 | 12/1987 | Striplin | 211/13 X |

*Primary Examiner*—Robert W. Gibson, Jr.
*Attorney, Agent, or Firm*—Griffin, Branigan & Butler

[57] ABSTRACT

A remote control unit orientation and storage device (18) includes four wall members (20A, 20B, 20C, and 20D) that define both a plurality of open cells (84A, 84B, 84C, and 84D) for selective engagement of remote control units (81A, 81B, 81C, and 81D) and an internal cell (86) in which accessories (92, 94) are storable. Fastener means (80) provided on wall members forming the cells facilitate secure mounting of remote control units within the cell, and also permit selective removal of remote control units.

18 Claims, 3 Drawing Sheets

ORIENTATION AND STORAGE APPARATUS FOR REMOTE CONTROL UNIT

BACKGROUND

I. Field of the Invention

This invention pertains to apparatus for the orientation, storage, and display of electronic remote control units.

II. Prior Art and Other Considerations

Remote control units are nowdays provided for a great variety of electronic equipment, including television and audio/visual equipment. In general, electronic remote control units for such equipment have greatly enhanced user convenience and pleasure.

There is a tendency among some equipment users, however, to misplace remote control units. In this context misplacement may mean (1) loss of a remote control unit, or (2) not having all remote control units in the desired location, within easy reach of the user. An example of this is when the user desires to operate a video cassette recorder (VCR) to display information on a television. The remote control units for both the VCR and television are required to accomplish this. If both the television and VCR remote control units are not in the desired remote location, one or both may be considered misplaced, although they may not be lost.

Misplacement is likely to occur in an environment devoid of a suitable storage location for a remote control unit. When a control unit lacks a designated storage location, the control unit is often simply left to lie on a table or shelf, perhaps separate from the other necessary remote control units. Even when a storage location is provided for a remote control unit, the remote control unit must usually be withdrawn from the storage location for proper orientation relative to the controlled equipment before it can be used. In this case, return of the remote control unit to the storage location is not always assured. Thus, if a storage location is not provided, or if a remote control unit is not consistently returned to a storage location, the remote control unit may clutter or detract from the organizational or aesthetic appeal of the environment.

The problem of remote control unit storage and management is compounded when a plurality of control units are operated in a particular environment. The problem is also greatly exacerbated if the controlled equipment has many detached accessories or papers associated therewith, such as television program listings and the like.

In view of the foregoing, it is an object of the present invention to provide an apparatus for storing one or more remote control units.

An advantage of the present invention is the provision of apparatus for orienting one or more remote control units for use.

An advantage of the present invention is the provision of apparatus for storing one or more remote control units, and for orienting a remote control unit for use so that the remote control unit need not necessarily be removed from the apparatus for operation thereof.

Another advantage of the present invention is the provision of apparatus for storing one or more remote control units and additionally for storing accessories and items related to the controlled equipment.

SUMMARY

A remote control unit orientation and storage device includes four wall members that define both a plurality of open cells for selective engagement of remote control units and an internal cell in which accessories are storable. Fastener means provided on wall members forming the open cells facilitate secure mounting of remote control units within the external cell, and also permit selective removal of remote control units.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
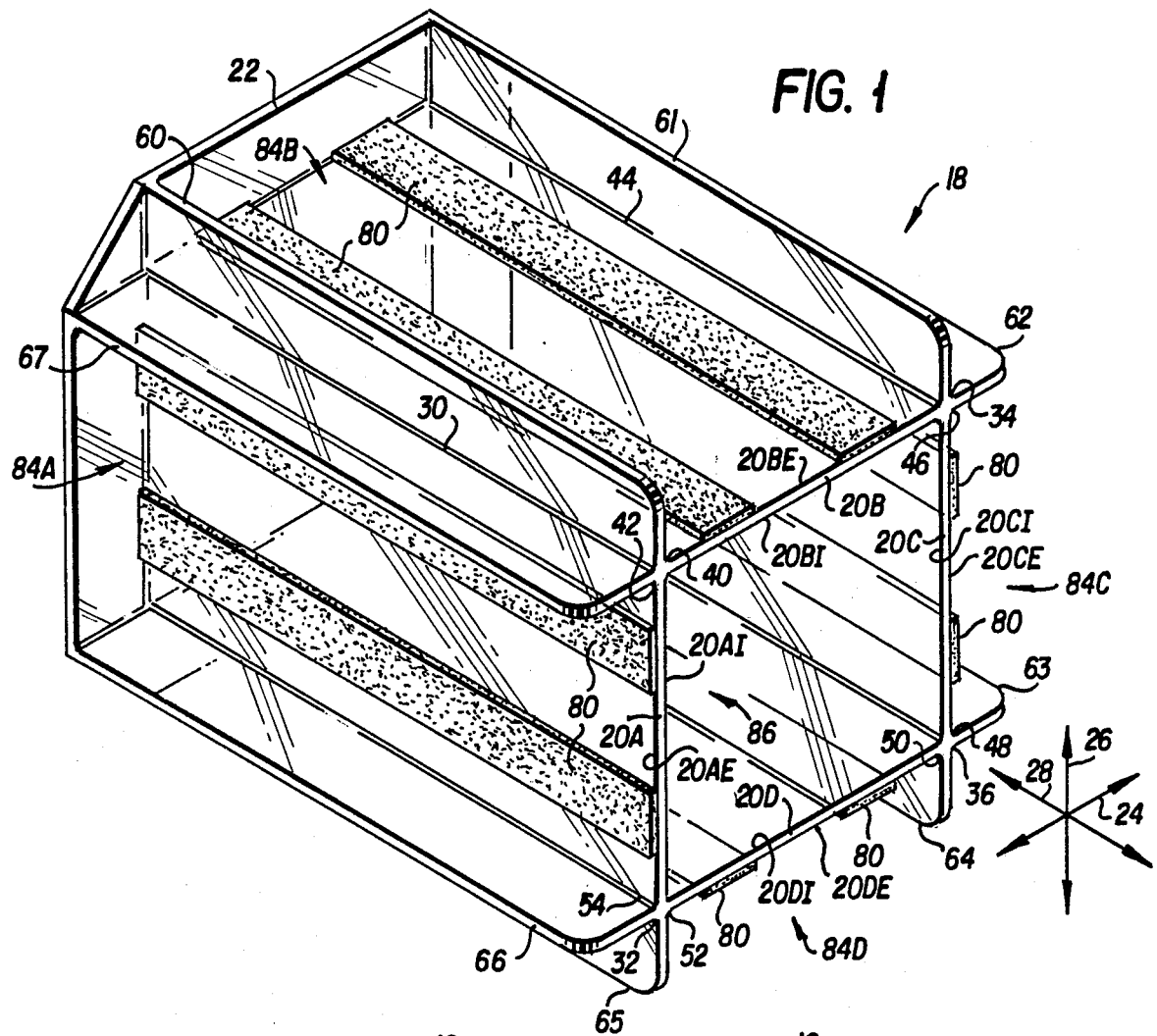
FIG. 1 is an isometric view of a remote control unit orientation and storage device according to a first embodiment of the invention.

FIG. 1 shows a remote control unit orientation and storage device 18 according to a first embodiment of the invention. The remote control unit orientation and storage device of the embodiment of FIG. 1 comprises four essentially planar wall members, particularly wall members 20A, 20B, 20C, and 20D, and a base member 22.

Figure 2A:
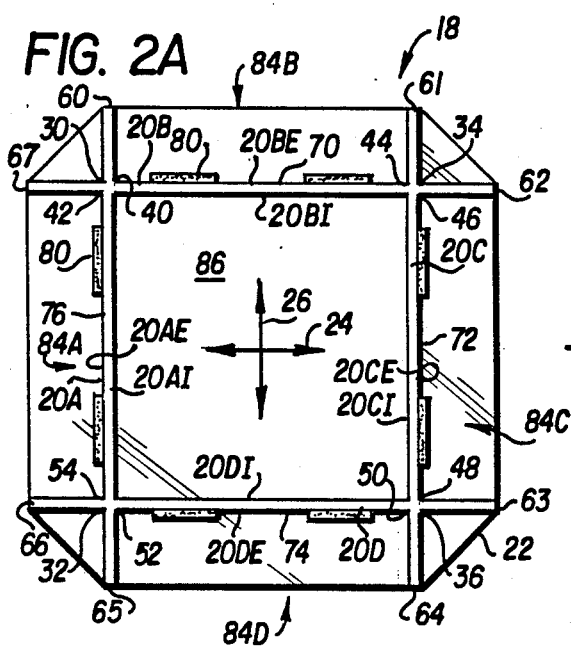
FIG. 2A is an end view of the remote control unit orientation and storage device of the embodiment of FIG. 1.
Figure 2B:
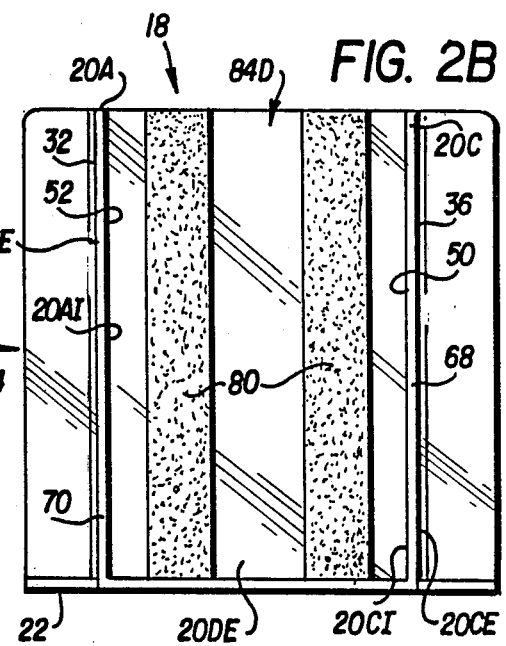
FIG. 2B is a side view of the remote control unit orientation and storage device of the embodiment of FIG. 1.

Each wall member 20A, 20B, 20C, and 20D, has both an interior surface and an exterior surface. For example, wall member 20A has an interior surface 20AI and an exterior surface 20AE; wall member 20B has an interior surface 20BI and an exterior surface 20BE; and so forth;

The orientation of the wall members 20A, 20B, 20C, and 20D is best understood with reference to the three rectangular axes 24, 26, and 28 shown in FIGS. 1, 2A, and 2B. Wall members 20A and 20C lie in planes that are parallel to the plane formed by the intersection of orthogonal axes 26 and 28. Wall members 20B and 20D lie in planes that are parallel to the plane formed by the intersection of orthogonal axes 24 and 28. Thus, wall members 20A and 20C are parallel to one another and are orthogonal to wall members 20B and 20D.

The wall members 20A, 20B, 20C, and 20D are connected together in such a manner that each wall member orthogonally intersects two adjacent wall members. That is, wall surface 20AE intersects wall surface 20BE along line 30; wall surface 20AE intersects wall surface 20DE along line 32; wall surface 20BE intersects wall surface 20CE along line 34; and, wall surface 20CE intersects wall surface 20DE along line 36. Wall surface 20AI intersects wall surface 20BE along line 40; wall surface 20AE intersects wall surface 20BI along line 42; wall surface 20BE intersects wall surface 20CI along line 44; wall surface 20BI intersects wall surface 20CE along line 46; wall surface 20CE intersects wall surface 20DI along line 48; wall surface 20DE intersects wall surface 20CI along line 50 and wall surface 20AI along line 52; and, wall surface 20DI intersects wall surface 20AE along line 54.

Each wall member has spacer means provided thereon. The line at which a wall member intersects an orthogonal wall member is spaced away from the edge of each intersecting wall member. For example, edge 60 of wall member 20A is spaced away from the line 30 at which wall member 20A intersects wall member 20B. Likewise, edge 61 of wall member 20C is spaced away from the line 44; edge 62 of wall member 20B is spaced away from the line 46; edge 63 of wall member 20D is spaced away from the line 48; edge 64 of wall member 20C is spaced away from the line 50; edge 65 of wall member 20A is spaced away from the line 52; edge 66 of wall member 20D is spaced away from the line 54; and, edge 67 of wall member 20B is spaced away from the line 42. The extent of the spacing of an edge from a line is dependent upon the depth of the remote control unit that is to be accommodated in the cell. In particular, the spacing must be sufficiently large so that, when the entire apparatus is place on its side (with remote control units attached for operation), the remote control unit facing down will not contact a surface upon which the apparatus rests. In the preferred embodiment, the spacing between an edge and a line is about 1.25 inches. As will be described hereinafter, this manner of wall intersection results in the formation of four suitably sized open cells about the exterior of the device 18.

In the illustrated embodiment, the base member 22 lies in a plane parallel to a plane formed by the intersection of axes 24 and 26. The base 22 is thus orthogonal to each of the wall members 20A, 20B, 20C, and 20D. As seen in FIG. 2A, in the illustrated embodiment the base member is essentially octagonal in shape; although not all sides of the octagon are of equal length.

The wall members 20A, 20B, 20C, and 20D, and the base 22, can be formed from any suitable material In the preferred embodiment, the wall and base members are formed from plastic An intermediate segment 70 of exterior wall surface 20BE lies between lines 40 and 44. Similarly, intermediate segment 72 of exterior wall surface 20CE lies between lines 46 and 48; intermediate segment 74 of exterior wall surface 20DE lies between lines 50 and 52; and, intermediate segment 76 of exterior wall surface 20AE lies between lines 54 and 42. In the preferred embodiment, each intermediate segment extends about 3.0 inches between its boundary lines, in order to accomodate the majority of remote control units currently marketed.

Each intermediate segment 70, 72, 74, and 76 has fastening means provided thereon adapted to mate with corresponding fastening means on a remote control unit. In the illustrated embodiment, the fastening means comprises elongated strips 80 of hook material suitable for mating with corresponding loop material. Fasteners of this type are commonly known in the trade as "Velcro". Each intermediate segment 70, 72, 74, and 76 has two elongated strips of fastener material provided thereon. The fastener material is secured to the intermediate segments by an adhesive, e.g. the fastener material may be adhesively backed.

Figure 6:
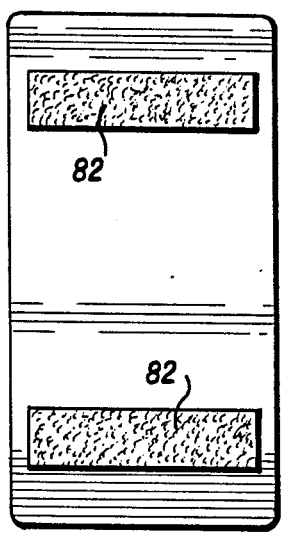
FIG. 6 is a back view of a remote control unit of the type storable in embodiments of the invention.

FIG. 6 is a back view of a remote control unit 81 showing mating fastening means provided thereon. Two strips 82 of fastening material are secured to the back of remote control unit 81. As mentioned above, the fastening means provided on the back of control unit 81 mates with the fastener means provided on the intermediate segments of the exterior wall members. The fastening means 82 is preferably secured on the back of a remote control unit 81 by adhesive and, as is the case with fastener 80, may be adhesively backed.

The device 18 thus has four open cells 84A, 84B, 84C, and 84D. Cell 84A is defined by intermediate segment 76, the spacer portion of wall surface 20DI that extends from edge 66 to line 54, and the spacer portion of wall surface 20BI that extends from edge 67 to line 42. Likewise, cell 84B is defined by intermediate segment 70, the spacer portion of wall surface 20AI that extends from edge 60 to line 40, and the spacer portion of wall surface 20CI that extends from edge 61 to line 44. Cells 84C and 84D are analogously defined. Each cell 84A, 84B, 84C, and 84D is sized so as to accommodate therein a remote control unit.

The four wall members 20A, 20B, 20C, and 20D define, along two rectangular axes, an interior cell 86. In particular, wall surfaces 20AI, 20BI, 20CI, and 20DI define interior cell 86 with respect to the axes 24 and 26. The base 22 forms a boundary for one end of the interior cell 86 with respect to the axis 28. The other end of the interior cell 86 is left unbounded along the axis 28.

Figure 3A:
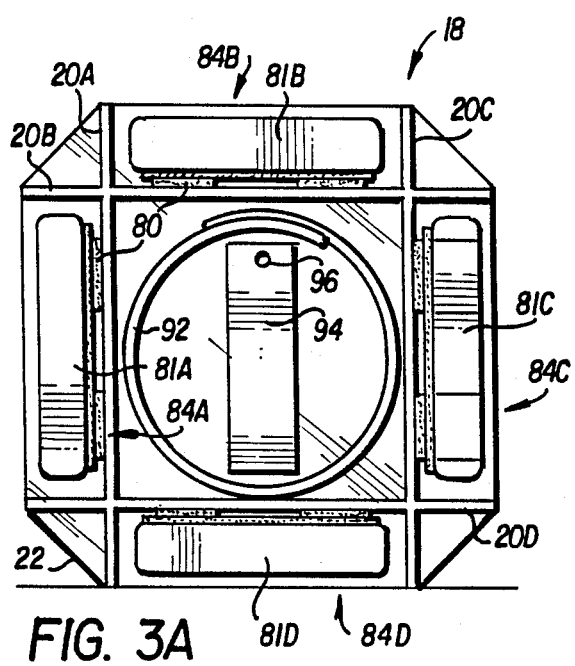
FIG. 3A is an end view of the remote control unit orientation and storage device of the embodiment of FIG. 1, additionally showing the placement of a plurality of remote control units and accessories therein.
Figure 3B:
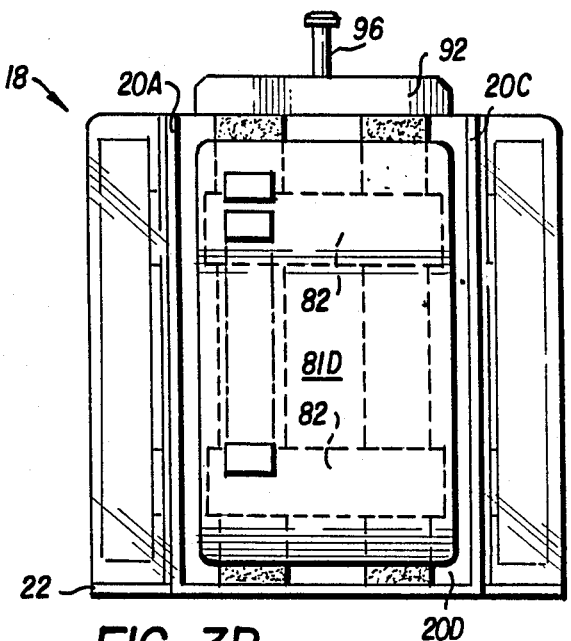
FIG. 3B is a side view of the remote control unit orientation and storage device of the embodiment of FIG. 1, additionally showing the placement of a plurality of remote control units and accessories therein.

FIGS. 3A and 3B illustrate the remote control unit orientation and storage device 18 in use. A first remote control unit 81A is shown stored in cell 84A; a second remote control unit 81B is shown stored in cell 84B; third remote control unit 81C is shown stored in cell 84C; and, a fourth remote control unit 81D is shown stored in cell 84D. Each remote control unit 81 is placed into an appropriate cell 84 such that the fastening means 82 on the back of the remote control unit securely engages the fastening means 80 provided on the intermediate segment of the exterior wall forming the cell 84. A periodical 92, such as the type that provides television programming information, for example, is curled upon itself and stored in the interior cell 86. A portable telephone receiver 94 with an antenna 96 is centrally stored in the interior cell 86.

Figure 4A:
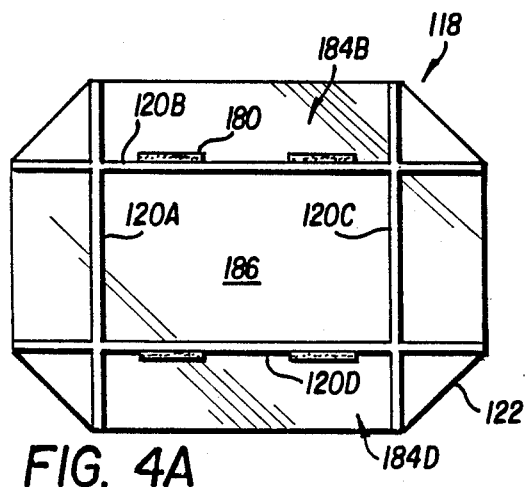
FIG. 4A is an end view of a remote control unit orientation and storage device of another embodiment.
Figure 5:
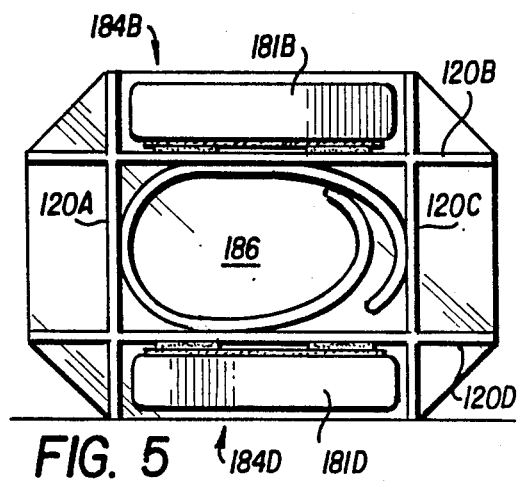
FIG. 5 is an end view of the remote control unit orientation and storage device of the embodiment of FIG. 4A, additionally showing the placement of a plurality of remote control units and accessories therein.
Figure 4B:
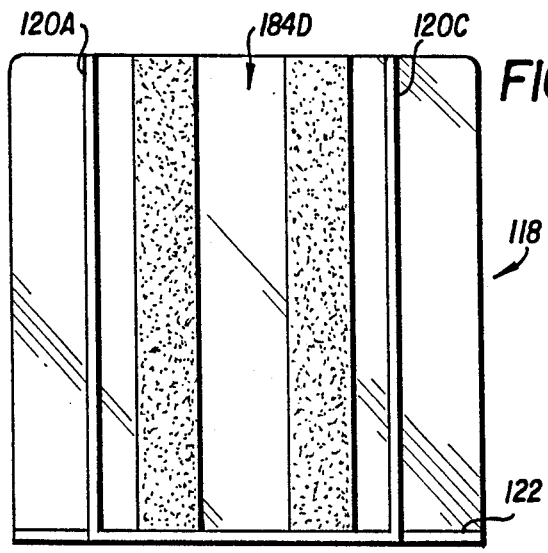
FIG. 4B is a side view of the remote control unit orientation and storage device of the embodiment of FIG. 4A.
Figure 4C:
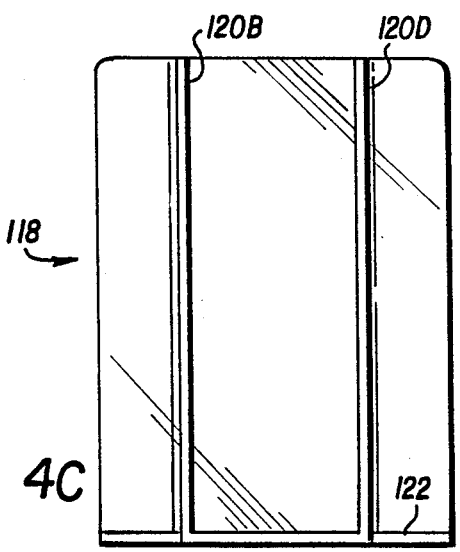
FIG. 4C is a front view of the remote control unit orientation and storage device of the embodiment of FIG. 4A.

The remote control unit orientation and storage device 118 of FIGS. 4A, 4B, and 4C resembles the embodiment of FIG. 1, but has two (rather than four) open cells sized for storage of remote control units therein. The four wall members 120A, 120B, 120C and 120D are connected together so as to form two open cells 120B and 120D suitably sized for reception of remote control units. The four wall members 120A, 120B, 120C, and 120D, together with base member 122, connect together so as to form an interior cell. In all other respects, the features of the remote control unit orientation and storage device 118 of FIGS. 4A, 4B, and 4C are analogous to the device 18 of the embodiment of FIG. 1. FIG. 5 shows the storage of remote control unit 181B in cell 184B and remote control unit 181D in cell 184D.

The devices 18 and 118 of the invention are attractively positionable on furniture or other equipment by standing the same upon its base member. The devices can be turned or oriented toward controlled equipment (either by holding the entire apparatus in the hand or by resting the unit on its side) so that the particular remote control unit associated with the controlled equipment is facing upward and correctly pointed to, or otherwise assumes a proper relationship with, the controlled equipment. Thus, the remote control units stored in the device need not necessarily be withdrawn therefrom for use. Moreover, the remote control units remain securely mounted on the storage device despite any movement or manipulation of the device. Should it be desirable to remove a remote control unit form the storage device, the fastening means provided easily facilitates removal and re-engagement of a remote control unit relative to the storage device.

Figure 7A:
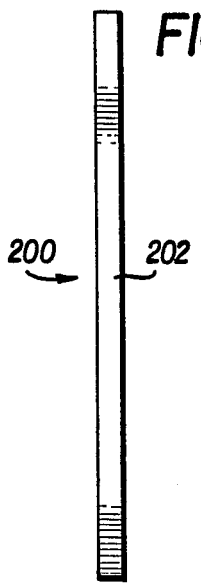
FIG. 7A is a side view of an adapter for use with the remote control unit orientation and storage device of the invention.
Figure 7B:
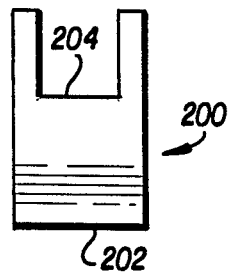
FIG. 7B is a cross-sectioned end view of the adapter of FIG. 7A.
Figure 7C:
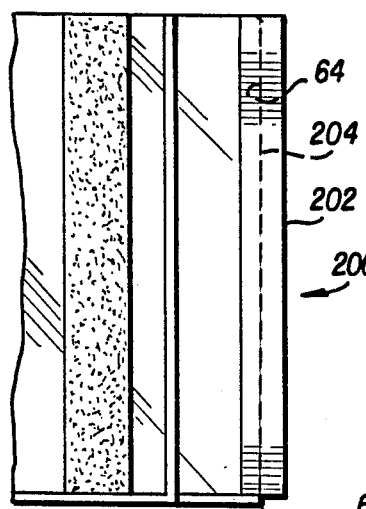
FIG. 7C is a partial side view of a device of the invention showing the use of the adapter of FIG. 7A thereon.
Figure 7D:
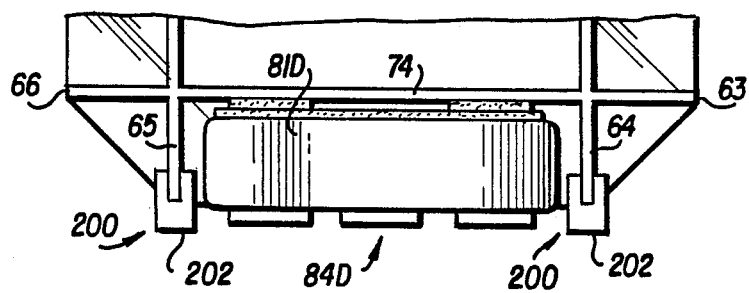
FIG. 7D is a partial end view of a device of the invention showing the use of the adapter of FIG. 7A thereon.

FIGS. 7A and 7B show an adapter 200 for use with the devices 18 and 118 of the invention. The adapter 200 comprises an elongated member 202 having a channel 204 formed along one side of an elongated edge thereof. The channel 204 is suitably formed to fit over an edge, such as edge 64, of the device. Accordingly, when two of adapters 200 are fitted over adjacent edges, such as edges 64 and 65, the adapters 200 serve to selectively increase the size (i.e. depth) of their corresponding open cell, such as cell 84D. Thus, the adapters 200 comprise the spacer means for spacing an exterior wall (such as wall 76) and a remote control unit (such as unit 81D) away from a surface upon which the device rests.

While the invention has been particularly shown and described with reference to the preferred embodiments thereof, it will be understood by those skilled in the art that various alterations in form and detail may be made therein without departing from the spirit and scope of the invention. The size of the storage cells may be increased in other embodiments or via the addition of adapters or accessories, in order to accomodate remote control units of larger widths and thicknesses, if such remote control units become prevalent in the market place.

The embodiments of the invention in which an exclusive property or privilege is claimed are defined as follows:

1. An apparatus for storing a unit such as an electronic control unit, said apparatus comprising:
at least three wall members connected together whereby surfaces thereof at least partially define an interior cell along two rectangular axes, said surfaces of said wall members defining said interior cell being interior surfaces of said wall members, said interior surfaces of each wall member having an oppositely disposed exterior surface parallel thereto;
a base member connected to said wall members for bounding said interior cell along a third rectangular axis at a first end of said wall members, said interior cell being unbounded along said third rectangular axis at a second end of said wall members whereby said interior cell is capable of receiving articles for storage therein; and,
fastening means provided on an exterior surface of at least one of said wall members for mating with complementary fastening means on a unit to be stored on said apparatus.

2. The apparatus of claim 1, wherein said base member is essentially planar.

3. The apparatus of claim 1, wherein at least one of said wall members intersects two other wall members along lines which are spaced away from the edges of said two other wall members, thereby forming an open exterior cell having three walls sized to accommodate a unit therebetween.

4. The apparatus of claim 3, wherein at least two of said wall members intersect two other wall members along lines which are spaced away from the edges of said two other wall members, thereby forming two open exterior cells, each cell having three walls sized to accommodate a unit therebetween.

5. The apparatus of claim 4, wherein each of said wall members intersects two other wall members along lines which are spaced away from the edges of said two other wall members, thereby forming open exterior cells, each cell having three wall segments sized to accommodate a unit therebetween.

6. The apparatus of claim 3, wherein said wall member which intersects said two other wall members has said fastening mean provided thereon.

7. The apparatus of claim 1, wherein four wall members are connected together.

8. The apparatus of claim 1, wherein at least one of said wall members has spacer means mounted thereon, for sufficiently spacing said at least one wall member from a surface upon which said apparatus rests.

9. An apparatus for storing a unit such as an electronic control unit, said apparatus comprising:
at least three wall members connected together;
fastening means provided on an exterior surface of at least one of said wall members for mating with complementary fastening means on a unit to be stored on said apparatus; a plurality of spacer means, each spacer means being mounted on an associated one of said wall members for sufficiently spacing said two wall members from a surface upon which said apparatus rests so that, when an electronic control unit is fastened on said exterior surface of said at least on wall member, said electronic control unit does not contact said 10. An apparatus for storing a unit such as an electronic control unit, said apparatus comprising:
at least three wall members connected together, wherein at least one of said wall members intersects two other wall members along lines which are spaced away from the edges of said two other wall members, thereby forming an open exterior cell sized to accommodate a unit therebetween;

fastening means provided on an exterior surface of at least one of said wall members for mating with complementary fastening means on a unit to be stored on said apparatus;

spacer means mounted on at least two of said wall members for sufficiently spacing said two wall members from a surface upon which said apparatus rests so that, when an electronic control unit is fastened on said exterior surface of said at least one wall member, said electronic control unit does not contract said surface upon which said apparatus rests;

wherein said spacer means comprises adaptor members, each adaptor member having a channel therein which fits over an edge of one of said two other wall members whereby said adaptor members lengthen said two other wall members.

11. The apparatus of claim 10, wherein said adaptor members are elongated members having channels that fit over edges of said two other wall members.

12. An apparatus for storing a unit such as an electronic control unit, said apparatus comprising:

at least three wall members connected together whereby surfaces thereof at least partially define an interior cell along two rectangular axes, said surfaces of said wall members defining said interior cell being interior surfaces of said wall members, said interior surfaces of each wall member having an oppositely disposed exterior surface parallel thereto, wherein each of said wall members intersects two other wall members along lines which are spaced away from the edges of said two other wall members, thereby forming open exterior cells having three walls sized to accommodate a unit therebetween, said lines at which said wall members intersect being sufficiently spaced away from the edges of said wall members such that, when an electronic control unit is fastened to an exterior surface of one of said exterior cells and said edges of said two other wall members forming said exterior cell rest upon a support surface, said electronic control unit does not contact said support surface; and, fastening means provided on an exterior surface of at least one of said wall members for mating with complementary fastening means on a unit to be stored on said apparatus.

13. The apparatus of claim 12, further comprising:

a base member connected to said wall members for bounding said interior cell along a third rectangular axis at a first end of said wall members.

14. The apparatus of claim 13, wherein said base member is essentially planar.

15. The apparatus of claim 13, wherein said interior cell is unbounded along said third rectangular axis at a second end of said wall members whereby said interior cell is capable of receiving articles for storage therein.

16. The apparatus of claim 13, wherein said wall member which intersects said two other wall members has said fastening means provided thereon.

17. The apparatus of claim 13, wherein four wall members are connected together.

18. The apparatus of claim 13, wherein at least one of said wall members has spacer means mounted thereon for sufficiently spacing said at least one wall member from said support surface upon which said apparatus rests.

* * * * *